(12) United States Patent
Braunstein et al.

(10) Patent No.: US 12,263,754 B2
(45) Date of Patent: Apr. 1, 2025

(54) BATTERY MANAGEMENT FOR ELECTRIC MATERIAL- DISPENSING MACHINE

(71) Applicant: Caterpillar Inc., Peoria, IL (US)

(72) Inventors: Michael Dennis Braunstein, Washington, IL (US); Cameron Thomas Lane, Oro Valley, AZ (US)

(73) Assignee: Caterpillar Inc., Peoria, IL (US)

( * ) Notice: Subject to any disclaimer, the term of this patent is extended or adjusted under 35 U.S.C. 154(b) by 755 days.

(21) Appl. No.: 17/537,405

(22) Filed: Nov. 29, 2021

(65) Prior Publication Data

US 2023/0166632 A1 Jun. 1, 2023

(51) Int. Cl.
  *B60L 58/13* (2019.01)
  *G01R 31/382* (2019.01)
  *B60L 58/16* (2019.01)
  *G01R 31/00* (2006.01)

(52) U.S. Cl.
  CPC ............ *B60L 58/13* (2019.02); *G01R 31/382* (2019.01); *B60L 58/16* (2019.02); *B60L 2200/40* (2013.01); *B60L 2240/62* (2013.01); *B60L 2260/54* (2013.01); *G01R 31/007* (2013.01)

(58) Field of Classification Search
  CPC ...... B60L 58/13; B60L 58/16; B60L 2200/40; B60L 2240/62; B60L 2260/54; G01R 31/382; G01R 31/007
  USPC .................................. 320/104, 109, 132, 136
  See application file for complete search history.

(56) References Cited

U.S. PATENT DOCUMENTS

| | | | |
|---|---|---|---|
| 7,841,433 B2 | 11/2010 | Soliman et al. | |
| 8,360,343 B2 | 1/2013 | Gudat et al. | |
| 8,543,272 B2 | 9/2013 | Yu et al. | |
| 8,983,657 B2 | 3/2015 | Jacobson | |
| 8,983,675 B2 | 3/2015 | Dawson et al. | |
| 9,283,954 B2 | 3/2016 | Dalum | |
| 9,545,854 B2 | 1/2017 | Daum et al. | |
| 9,612,130 B2 * | 4/2017 | Liu | G01C 21/3694 |
| 9,669,821 B1 | 6/2017 | Laing | |
| 9,805,317 B2 | 10/2017 | Gudat et al. | |

(Continued)

FOREIGN PATENT DOCUMENTS

| | | |
|---|---|---|
| CN | 103991384 B | 8/2014 |
| CN | 103818264 B | 3/2016 |

(Continued)

OTHER PUBLICATIONS

Written Opinion and International Search Report for Int'l. Patent Appln. No. PCT/US2022/050021, mailed Mar. 22, 2023 (8 pgs).

*Primary Examiner* — Edward Tso
*Assistant Examiner* — Aaron Piggush

(57) ABSTRACT

A system can assign a machine to dispense material at designated areas along a route at a worksite. For example, the machine can be an electric water truck on a mine site, and the electric water truck can be assigned to spray water at areas along a route to control dust on the mine site. The system can verify that the machine is carrying enough material to dispense along the assigned route. The system can also verify that the battery of the machine is charged to a level sufficient to power travel of the machine through the assigned route and to power operations to dispense the material, based at least in part on a changing amount and/or weight of the material as the machine progresses along the route.

20 Claims, 4 Drawing Sheets

(56) References Cited

U.S. PATENT DOCUMENTS

| | | |
|---|---|---|
| 10,696,164 B2 | 6/2020 | Zhao et al. |
| 10,753,761 B2 | 8/2020 | Ricci |
| 10,787,092 B2 | 9/2020 | Hou et al. |
| 10,800,398 B2 | 10/2020 | Duan et al. |
| 10,836,371 B1 | 11/2020 | Thiruvengadam et al. |
| 10,882,399 B2 | 1/2021 | Koebler et al. |
| 10,946,764 B2* | 3/2021 | Morimoto ............... B60L 58/13 |
| 12,038,769 B2* | 7/2024 | Lane ...................... B60L 58/13 |
| 2012/0316717 A1 | 12/2012 | Daum et al. |
| 2013/0325335 A1* | 12/2013 | Kee .................... G01C 21/3469 |
| | | 701/527 |
| 2014/0089172 A1 | 3/2014 | Hyde et al. |
| 2014/0114514 A1 | 4/2014 | Crombez et al. |
| 2018/0060776 A1 | 3/2018 | Ahmed et al. |
| 2018/0111496 A1 | 4/2018 | Cholewa et al. |
| 2018/0204161 A1 | 7/2018 | Sandulescu et al. |
| 2019/0344777 A1 | 11/2019 | Ourabah et al. |
| 2020/0122728 A1 | 4/2020 | Murase |
| 2021/0008997 A1 | 1/2021 | Marsolek |
| 2022/0244061 A1* | 8/2022 | Mellinger ......... B60W 30/1882 |

FOREIGN PATENT DOCUMENTS

| | | |
|---|---|---|
| CN | 107117038 B | 9/2017 |
| CN | 10979537 A | 5/2019 |
| CN | 109878355 A | 6/2019 |
| CN | 111366211 A | 7/2020 |
| CN | 111907335 A | 11/2020 |
| JP | 2017154693 A | 9/2017 |
| KR | 20180049412 A | 5/2018 |
| KR | 20190012552 A | 2/2019 |
| KR | 102226162 B1 | 3/2021 |
| WO | 2011111145 A1 | 9/2011 |
| WO | WO2019210745 A1 | 11/2019 |
| WO | WO2020199873 A1 | 10/2020 |

\* cited by examiner

BATTERY MANAGEMENT FOR ELECTRIC MATERIAL- DISPENSING MACHINE

TECHNICAL FIELD

The present disclosure relates to battery-powered electric machines and, more particularly, to managing a state of charge (SoC) of a battery of an electric water truck or other electric machine that dispenses material while traveling.

BACKGROUND

Electric machines, such as vehicles or other mobile machines, that are at least partially powered by on-board batteries can be environmentally-friendly alternatives to machines powered by fossil fuels. The SoC of a battery of an electric machine can vary over time, for instance as the battery is charged or discharged. For example, the battery can be charged when the machine is connected to a charging station or other external power source, and/or when a regenerative braking system captures energy during deceleration of the machine. Some operations of the machine, such as operations to propel movement of the machine, can consume energy stored in the battery, and thereby discharge the battery.

Various systems have been developed to manage the SoC of a battery for a machine. For example, U.S. Pat. No. 10,946,764 to Morimoto et al. (hereinafter "Morimoto") describes a system configured to predict the SoC of a battery of a hybrid vehicle based on a scheduled route. If the system described in Morimoto predicts that the battery will be in a fully charged state along the scheduled route, the system can cause the vehicle to at least partially discharge the battery to a lower SoC, so that the battery can be charged again based on energy captured by a regenerative braking system of the vehicle along the scheduled route. The system described in Morimoto can avoid wasting energy captured by the regenerative braking system along the scheduled route, and thereby improve a fuel consumption metric associated with the hybrid vehicle.

However, although the system described by Morimoto and/or other existing systems may be able to predict a SoC of a battery of an electric vehicle or a hybrid vehicle at one or more locations along a route, such existing systems generally assume that a weight and/or payload of a vehicle or other machine will be static during travel along the route. Accordingly, such systems may not be applicable to a water truck that sprays water from a tank during travel along a route, or to other material-dispensing machines that dispense stored material to the surrounding environment while traveling, because the weight of the payload carried by such a machine can decrease as the machine travels throughout a route and dispenses water or other material carried by the machine. Existing systems generally do not account for decreases in payloads carried by water trucks or other material-dispensing machines when predicting energy consumption and SoC levels associated with routes for such machines.

The example systems and methods described herein are directed toward overcoming one or more of the deficiencies described above.

SUMMARY OF THE INVENTION

According to a first aspect, a computer-implemented method includes determining, by one or more processors, a route associated with one or more material dispense areas. The computer-implemented method also includes determining, by the one or more processors, a total amount of a material to be dispensed, at the one or more material dispense areas, by a machine having one or more material dispensers configured to dispense the material. The computer-implemented method further includes determining, by the one or more processors, an expected energy consumption level, associated with traversal of the route by the machine. The expected energy consumption level is based on a material dispense energy consumption level associated with powering the one or more material dispensers to dispense the material at the one or more material dispense areas. The expected energy consumption level is also based on a travel energy consumption level associated with powering travel of the machine through the route, the travel energy consumption level being based at least in part on predicted changes to a weight of the material carried by the machine through the route. The computer-implemented method also includes assigning, by the one or more processors, the route to the machine.

According to a further aspect, a computing system includes one or more processors and memory storing computer-executable instructions. The computer-executable instructions, when executed by the one or more processors, cause the one or more processors to perform operations. The operations include determining a route associated with one or more material dispense areas. The operations also include determining a total amount of a material to be dispensed, at the one or more material dispense areas, by a machine having one or more material dispensers configured to dispense the material. The operations further include determining an expected energy consumption level, associated with traversal of the route by the machine. The expected energy consumption level is determined based on a material dispense energy consumption level associated with powering the one or more material dispensers to dispense the material at the one or more material dispense areas. The expected energy consumption level is also determined based on a travel energy consumption level associated with powering travel of the machine through the route, the travel energy consumption level being based at least in part on predicted changes to a weight of the material carried by the machine through the route. The operations also include assigning the route to the machine.

According to another aspect, a dispatch controller includes one or more processors and memory storing computer-executable instructions. The computer-executable instructions, when executed by the one or more processors, cause the one or more processors to perform operations. The operations include determining a route associated with one or more material dispense areas. The operations also include determining an expected energy consumption level associated with traversal of the route by a machine having one or more material dispensers configured to dispense the material. The expected energy consumption level is based on a material dispense energy consumption level associated with powering the one or more material dispensers to dispense the material at the one or more material dispense areas. The expected energy consumption level is also based on a travel energy consumption level associated with powering travel of the machine through the route, the travel energy consumption level being based at least in part on predicted changes to a weight of the material carried by the machine through the route. The operations further include receiving machine data, from the machine, indicating a current state of charge of a battery of the machine. The operations additionally include determining that the current state of charge is at or above the expected energy consumption level associated with traversal of the route by the machine. The operations also include assigning the route to the machine in response to determining that the current SoC is at or above the expected energy consumption level.

BRIEF DESCRIPTION OF THE DRAWINGS

The detailed description is described with reference to the accompanying figures. In the figures, the left-most digit of a reference number identifies the figure in which the reference number first appears. The same reference numbers in different figures indicate similar or identical items.

DETAILED DESCRIPTION

Figure 1:
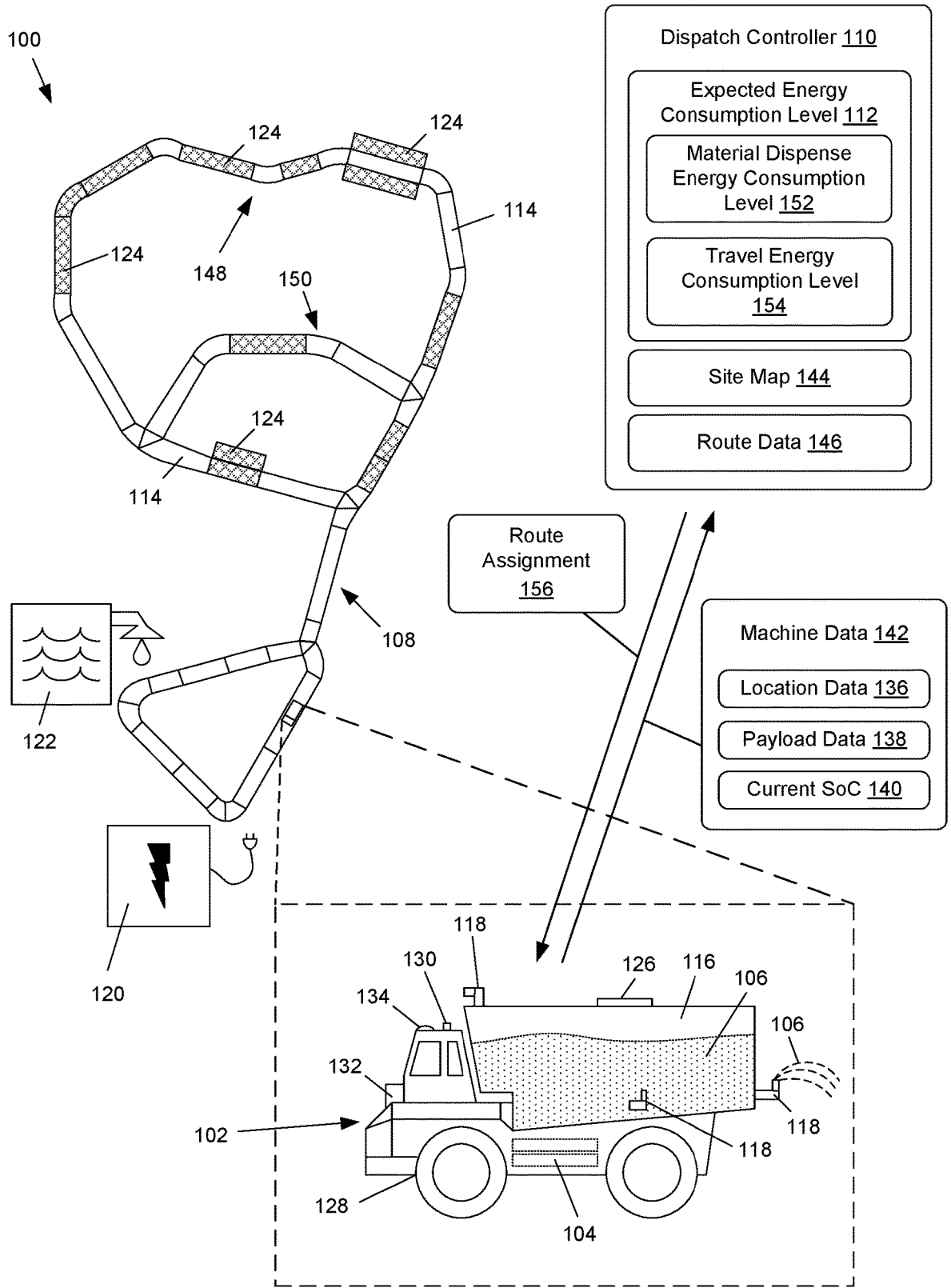
FIG. 1 shows an example worksite, and an example machine associated with the worksite.

FIG. 1 shows an example worksite 100, and an example machine 102 associated with the worksite 100. The machine 102 can be a mobile machine or vehicle that is configured to be at least partially powered by a battery 104. For example, the machine 102 can be a battery electric machine (BEM), a battery electric vehicle (BEV), a hybrid vehicle, a fuel cell and battery hybrid vehicle, or another mobile machine that is at least partially powered by the battery 104. The machine 102 can be a material-dispensing machine that is configured to dispense material 106 carried by the machine 102 to a surrounding environment as the machine 102 travels along a route 108. In some examples, a dispatch controller 110 associated with the worksite 100 can generate and/or assign the route 108 to the machine 102. In other examples, the machine 102 can generate the route 108 and/or select the route 108 from a set of available routes. The machine 102 and/or dispatch controller 110 can select and/or generate the route 108 for the machine 102 based on an expected energy consumption level 112 associated with the route 108. The expected energy consumption level 112 can be based on energy predicted to be consumed and/or captured by the machine 102 while the machine 102 traverses the route 108 and dispenses material 106 along the route 108. Dispensing material 106 along the route 108 can decrease the weight of the payload carried by the machine 102 as the machine 102 progresses along the route 108. Accordingly, as discussed further below, the machine 102 and/or the dispatch controller 110 can determine the expected energy consumption level 112 associated with the route 108 at least in part based on material dispense rates and decreasing payload amounts associated with segments 114 of the route 108.

The machine 102 can have a material container 116, such as a tank, reservoir, or other container configured to store up to a maximum amount of the material 106. The material 106 can be water, dust-suppression fluid, de-icing fluid, another type of fluid, rocks, salt, plant seeds, fertilizer, or another type of dispensable material. The machine 102 can also have one or more material dispensers 118 configured to dispense material 106 from the material container 116 to a surrounding environment.

In some examples, the material dispensers 118 can include nozzles, spray heads, and/or pumps configured to spray water or other fluid stored in the material container 116 to a surrounding environment. The material dispensers 118 can have, or be associated with, a fluid delivery pump. The fluid delivery pump can be an electrically-driven pump, such as a variable or fixed displacement pump. The fluid delivery pump can be driven by a dedicated motor, or can be driven by a drivetrain associated with one or more traction motors that drive propulsion of the machine 102. The material dispensers 118 can also have, or be associated with, one or more conduits that can draw fluid from the material container 116. In some examples, conduits can also carry pressurized fluid to control valves associated with spray heads and/or other elements of the material dispensers 118, such that pressure of fluid delivered to the control valves can control, at least in part, operations of the material dispensers 118. In other examples, operations of the material dispensers 118 can also, or alternately, be controlled via data instructions, electrical currents, or other signals.

In other examples, the material dispensers 118 can include spreaders configured to spread salt, rocks, seeds, fertilizer, or other material stored in the material container 116 to a surrounding environment. In still other examples, the material dispensers 118 can include any other type of dispenser or outlet configured to dispense material 106 from the material container 116 to the surrounding environment.

The machine 102 can be configured to control a material dispense pattern and/or rate associated with dispensing material 106 from one or more of the material dispensers 118. For example, the machine 102 can be configured to control a fluid delivery pump and/or control valves to alter flow rates, pressures, a number of spray heads in use, and/or other variables. The machine 102 can accordingly adjust a spray pattern associated with dispensing material 106 from one or more of the material dispensers 118, for instance by widening or narrowing a width of fluid flowing from one or more spray heads, activating or deactivating individual spray heads to control where the machine 102 disperses material 106 from, adjusting the timing and/or dispersal rate associated with individual spray heads, and/or controlling other factors associated with the material dispensers 118.

The machine 102 can, in some examples, be a commercial or work machine that operates at, and/or travels around, the worksite 100. The worksite 100 can be a mine site, a quarry, a construction site, a landfill, or any other type of worksite or work environment. The machine 102 can travel around the worksite 100, for example to a charging station 120, to a material refill station 122, and/or to one or more material dispense areas 124. As described further below, the machine 102 can travel to one or more selected material dispense areas 124 based on the route 108 selected or generated for the machine 102, and/or can visit one or both of the charging station 120 or the material refill station 122 while traveling along the route 108.

The charging station 120 can be a station or other location at which the machine 102 can be connected to an external power source to charge the battery 104. Accordingly, an SoC of the battery 104 of the machine 102 can be increased at the charging station 120. In some examples, the worksite 100 can have multiple charging stations, for instance at various locations at the worksite 100.

In other examples, the charging station 120 can be a trolley system associated with trolley lines that extend through the worksite 100. Accordingly, the charging station 120 can be, or be associated with, a network of trolley lines positioned around the worksite 100. In these examples, the machine 102 can have a pantograph or other type of connector configured to attach to the trolley lines, such that the machine 102 can receive energy from the trolley lines via such a connector as the machine 102 travels. In some examples, the route 108 can be generated such that the machine 102 can recharge the battery 104 during at least a portion of the route 108 by connecting to such trolley lines.

The material refill station 122 can be a station or other location at which the material container 116 of the machine 102 can be filled or refilled with material 106. The material container 116 can have a container inlet 126, such as a door, opening, valve, port, or other element that allows material 106 from the material refill station 122 to pass into the material container 116. Accordingly, an amount and/or weight of a payload of material 106 stored in the material container 116 and carried by the machine 102 can be increased at the material refill station 122. As a non-limiting example, if the machine 102 is a water truck, water can be dumped into the material container 116 through the container inlet 126 from an overhead nozzle or water outlet at the material refill station 122, or a water hose can be connected from the material refill station 122 to the container inlet 126 such that water can be pumped into the material container 116. In some examples, the worksite 100 can have multiple material refill stations, for instance at various locations at the worksite 100.

The material dispense areas 124 can be areas at locations on the worksite 100 that have been selected to receive material 106 dispensed by the machine 102. Selected material dispense areas 124 can be located on and/or proximate to the path of the route 108, or the route 108 can be generated to pass by or over selected material dispense areas 124. For instance, material dispense areas 124 can be full or partial segments 114 of the route 108, areas that extend along one or more other portions of the route 108, areas along one or more sides of the route 108, and/or other area associated with the route 108.

In some examples, the material dispense areas 124 can be selected by one or more users of the machine 102 and/or the dispatch controller 110. In other examples, the machine 102 and/or the dispatch controller 110 can be configured to automatically select material dispense areas 124, for example based on indications from dust sensors, cameras, moisture sensors, or other sensors positioned around the worksite 100 or mounted on machines that indicate when material 106 should be dispensed to areas of the worksite 100, based on elapsed times since material 106 was last dispensed at areas of the worksite 100, and/or based on other factors.

Selected material dispense areas 124 can also be associated with corresponding segments 114 of the route 108. For example, a particular segment of the route 108 can be associated with a material dispense area that extends along one side of the segment, be associated with material dispense areas that extend along both sides of the segment, and/or be associated with material dispense areas within boundaries of the segment.

As a non-limiting example, the machine 102 can be a water truck configured to spray water and/or other dust suppression fluids at designated material dispense areas 124 on a mine site, quarry, landfill, construction site, or other type of worksite. For instance, operations performed by excavators, haul trucks, and/or other machines and equipment at a mine site can generate dust that impairs visibility, reduces air quality, and/or otherwise impacts work at the worksite 100. Accordingly, the machine 102 can be a water truck assigned to travel the route 108 through the mine site to control dust by spraying water, and/or a fluid containing dust-suppressing chemicals, at one or more designated material dispense areas 124 along the route 108.

The machine 102 can have one or more electric engines, electric motors, electrical conversion systems, electric drivetrains, and/or other electrical components that are configured to convert and/or use energy, such as energy stored in the battery 104, to cause overall movement of the machine 102 while driving and/or to power operations of the material dispensers 118 to dispense material 106 stored in the material container 116 at material dispense areas 124. As an example, the machine 102 can have a traction motor that is configured to consume energy stored in the battery 104 to turn wheels of the machine 102. As another example, the material dispensers 118 can include pumps, nozzles, spray heads, and/or other elements that can consume energy stored in the battery 104 to spray water or other fluid toward material dispense areas 124. As discussed above, the machine 102 can control material dispense patterns and/or rates associated with dispersal of material 106 by the material dispensers 118. Accordingly, changes to the material dispense patterns and/or rates can change amounts of energy consumed by the material dispensers 118, as discussed further below.

The battery 104 of the machine 102 can include one or more batteries, such as lithium-ion (Li-ion) batteries, lithium-ion polymer batteries, nickel-metal hydride (NiMH) batteries, lead-acid batteries, nickel cadmium (Ni—Cd) batteries, zinc-air batteries, sodium-nickel chloride batteries, or other types of batteries. In some examples, multiple battery cells can be grouped together, in series or in parallel, within a battery module. Multiple battery modules can also be grouped together, for instance in series, within a battery string. One or more battery strings can be provided within a battery pack, such as a group of battery strings linked together in parallel. Accordingly, the battery 104 can include one or more battery packs, battery strings, battery modules, and/or battery cells.

The machine 102 can have one or more brake systems 128, such as a service brake system, a regenerative brake system, and/or a resistive brake system. The service brake system can be a hydraulic braking system or other braking system configured to apply brake pads against rotors to frictionally slow down wheels of the machine 102. The regenerative brake system can be configured to capture kinetic energy and/or potential energy during braking and/or deceleration of the machine 102, and to store the captured energy in the battery 104. The resistive brake system can be a dynamic braking system that is configured to similarly capture kinetic energy and/or potential energy during braking and/or deceleration of the machine 102, and to dissipate the energy as heat in one or more resisters in the machine 102.

The machine 102 can have one or more wireless communication interfaces 130, such as cellular interfaces, WiFi® interfaces, Bluetooth® interfaces, machine-to-machine data interfaces, and/or other types of wireless communication interfaces. The wireless communication interfaces 130 can include modems, receivers, transmitters, antennas, and/or other hardware or software elements configured to send and receive data. In some examples, the machine 102 can use the wireless communication interfaces 130 to communicate with the dispatch controller 110, as described further below. The machine 102 can also, in some examples, use the wireless communication interfaces 130 to communicate with other machines on the worksite 100, for instance to report the current location of the machine, determine locations of other machines, determine traffic and/or congestion information associated with the worksite 100, report the route 108 and material dispense areas 124 assigned to the machine 102, determine routes and material dispense areas 124 assigned to other machines, and/or exchange other types of information.

The dispatch controller 110 can be one or more servers, computers, or other off-board computing devices that are separate from the machine 102. For example, while the machine 102 can be located at the worksite 100, the dispatch controller 110 can be located at a back office or other location that is remote from the machine 102, or that is remote from the worksite 100 overall. In some examples, one or more functions of the dispatch controller 110 can be implemented by an application executing on a laptop computer, smartphone, tablet computer, or other mobile device, such as a mobile device used by an operator of the machine 102 or another user located away from the machine 102. The dispatch controller 110 can be configured to monitor operations of the machine 102, for instance based on data reported by the machine 102 via the wireless communication interfaces 130. In some examples, the dispatch controller 110 can also generate or select the route 108 for the machine 102, and instruct the machine 102 to travel along the route 108 and dispense material 106 at selected material dispense areas 124 associated with the route 108, as discussed further below.

The machine 102 can be a staffed machine, a semi-autonomous machine, or an autonomous machine. In examples in which the machine 102 is a staffed machine or a semi-autonomous machine, a human operator or driver can operate, control, or direct some or all of the functions of the machine 102. However, in examples in which the machine 102 is autonomous or semi-autonomous, functions of the machine 102, such as steering, speed adjustments, operations of the material dispensers 118, and/or other functions can be fully or partially controlled, automatically or semi-automatically, by on-board and/or off-board controllers or other computing devices associated with the machine 102.

As an example, the machine 102 can have an electronic control module (ECM) 132 or other on-board computing device that can fully or partially control operations of the machine 102. For instance, the machine 102 can have an on-board guidance system that can drive the machine 102 through the route 108 autonomously, an obstacle detection system that assists the on-board guidance system or can alert a human operator of nearby objects detected by the obstacle detection system, and/or other systems that fully or partially control operations of the machine 102. As another example, the dispatch controller 110 or another off-board computing device can receive data from the machine 102 and return instructions to the machine 102 to fully or partially control operations of the machine 102 remotely.

The machine 102 can have one or more sensors 134. The sensors 134 can include cameras, LIDAR sensors, RADAR sensors, other optical sensors or perception systems, Global Positioning System (GPS) sensors, other location and/or positioning sensors, payload sensors, speed sensors, temperature sensors, tire pressure sensors, battery state of health (SoH) sensors, and/or other types of sensors.

The GPS sensors or other location and/or positioning sensors can determine a location of the machine 102 on the worksite 100. For instance, GPS sensors can determine latitude and longitude coordinates, or other coordinates or positioning data, indicating a location of the machine 102. Such coordinates or other positioning data, determined by GPS sensors or other location and/or positioning sensors, can be included in location data 136 associated with the machine 102 as discussed further below.

Payload sensors can include pressure sensors, weight sensors, fill sensors, cameras or other optical sensors, and/or other sensors that can detect or estimate an amount of the material 106 stored in the material container 116 of the machine 102. Accordingly, the sensors 134 can determine payload data 138 associated with the amount of the material 106 stored in the material container 116, for instance based on a weight of the material 106 stored in the material container 116 and/or image data from a camera indicating an amount of the material 106 stored in the material container 116.

Battery SoH sensors can be configured to determine attributes associated with the battery 104. For example, the battery SoH sensors can detect a current SoC 140 of the battery 104. In some examples, one or more battery SoH sensors can also detect a state of health of the battery 104, such as abilities of the battery 104 to maintain a charge, receive a charge, and/or transfer energy at a power level. The battery SoH sensors can also, in some examples, detect temperatures associated with the battery 104, an operating state of a cooling system configured to cool the battery 104, and/or other attributes or characteristics of the battery 104.

In some examples, one or more of the sensors 134 can provide data to the ECM 132 of the machine 102 and/or the dispatch controller 110, such that the ECM 132 and/or the dispatch controller 110 can determine a location of the machine 102, detect nearby terrain, detect nearby objects, such as vehicles, other machines, or personnel, detect the positions of such nearby objects relative to the machine 102, use the payload data 138 to determine a current weight and/or amount of material 106 stored in the material container 116 of the machine 102, determine the current SoC 140 of the battery 104, and/or perform other operations. In some examples, the data provided by the sensors 134 can enable the machine 102 to drive and/or operate autonomously or semi-autonomously. Data associated with one or more of the sensors 134 can also be provided to a driver or other operator of the machine 102 via dashboard indicator lights, screens, or other displays, for instance if the machine 102 is a staffed machine.

The machine 102 can be configured to determine machine data 142. The machine data can include location data 136 indicating a current location of the machine 102, payload data 138 indicating a current amount of material 106 stored in the material container 116, and/or the current SoC 140 of the battery 104. In some examples, the machine 102 can transmit the machine data 142 to the dispatch controller 110. For example, the machine 102 can transmit machine data 142 to the dispatch controller 110 periodically, occasionally, on a predetermined schedule, in response to a request from the dispatch controller 110, based on one or more conditions or rules, or at any other time or for any other reason. The ECM 132 of the machine 102 can also receive and/or use the machine data 142 in some examples, as described further below.

The dispatch controller 110 and/or the ECM 132 can have, or have access to, a site map 144 associated with the worksite 100. The site map 144 can indicate terrain of the worksite 100, locations and/or identities of obstacles on the worksite 100, the location of the machine 102 on the worksite 100, locations of the charging station 120 and/or other charging stations on the worksite 100, locations of the material refill station 122 and/or other material refill stations on the worksite 100, locations of the material dispense areas on the worksite 100, ground types and/or ground conditions associated with portions of the worksite 100, and/or other information associated with the worksite 100. For instance, the site map 144 can indicate positions of fixed and/or movable obstacles on the worksite, such as other machines, personnel, lakes, ponds, rivers, cliff faces, hills, roads, intersections, mounds of dirt, gravel, or other material, and/or other types of objects, terrain features, or obstacles. The site map 144 can also indicate grades or slopes of portions of the worksite 100, such as incline levels or decline levels associated with portions of the worksite 100.

In some examples, the site map 144 can also indicate information associated with material dispense areas 124 or potential material dispense areas 124. For example, the site map 144 can indicate sensor data received from dust sensors, moisture sensors, cameras, or other sensors positioned at areas around the worksite 100 that indicate current dust conditions and/or whether material 106 should be dispensed to those areas of the worksite 100. As another example, the site map 144 can include data received from cameras, LIDAR sensors, RADAR sensors, or other sensors mounted on other machines that can indicate current dust conditions and/or whether material 106 should be dispensed to areas of the worksite 100. As yet another example, the site map 144 can indicate elapsed times since material 106 was dispersed at material dispense areas 124, how much material 106 was last dispersed at material dispense areas 124, and/or other material dispersal attributes associated with the material dispense areas 124.

The dispatch controller 110 and/or the ECM 132 can also have, or have access to, route data 146. The route data 146 can include data associated with one or more pre-determined routes, and/or data associated with one or more new routes generated by the dispatch controller 110 and/or the ECM 132. The route data 146 can indicate a path through the worksite associated with the route 108, locations of material dispense areas 124 along the route 108, material dispense rates associated with the material dispense areas 124, material dispense patterns associated with the material dispense areas 124, and/or other information associated with the route 108. In some examples, the route data 146 can be an element of the site map 144, reference locations indicated by the site map 144, or otherwise be associated with the site map 144.

In some examples, the route data 146 can indicate information associated with one or more predetermined routes through the worksite 100. In these examples, the dispatch controller 110 and/or the ECM 132 can select the route 108 for the machine 102 from among a set of available predetermined routes. For instance, the route data 146 can indicate a set of three available routes corresponding with three different sets of material dispense areas 124. The dispatch controller 110 and/or the ECM 132 can accordingly assign the machine 102 to traverse one of the three available routes, and assign other material-dispensing machines to traverse the other two available routes.

In other examples, the route data 146 can indicate multiple potential paths for the route 108, and the dispatch controller 110 and/or the ECM 132 can generate the route 108 based on one or more of the potential paths. For example, the route data 146 and/or the site map 144 can indicate paths of different roads that have been established on the worksite 100, such as a first road 148 and a second road 150. In this example, the route 108 for the machine 102 could pass along either, or both, the first road 148 or the second road 150 such that the machine 102 could dispense material 106 at different sets of material dispense areas 124 along the different roads. Accordingly, the dispatch controller 110 and/or the ECM 132 can select a particular path for the route 108 that follows one or both of the first road 148 or the second road 150. In some examples, the route data 146 can define attributes of a set of predetermined segments 114, such that the dispatch controller 110 and/or the ECM 132 can generate the route 108 by selecting and assembling a subset of the predetermined segments 114 defined by the route data 146.

As discussed above, the route 108 can be divided into segments 114. An individual segment can be a portion of the route 108 that has the same or similar attributes, such as a same or a similar incline level or decline level, a same or similar direction or orientation through the worksite 100, a same or similar ground type, or any other shared attributes. As an example, a portion of the route 108 can have multiple segments 114, such as a first segment that inclines at a consistent angle, a second segment that declines at a consistent angle, and a third angle that is substantially flat without an incline or a decline. The dispatch controller 110 and/or the ECM 132 can define the route 108 and the segments 114 of the route 108, for instance in the route data 146, based in part on terrain information indicated by the site map 144, such as grade information associated with the terrain of the worksite 100.

Individual segments 114 can also be associated with one or more material dispense areas 124, as discussed above. The route data 146 associated with such segments 114 can define material dispense attributes associated with the corresponding material dispense areas 124, such as amounts of material 106 to be dispensed at one or more material dispense areas 124 associated with a segment, material dispense rates associated with one or more material dispense areas 124 associated with a segment, a material dispense pattern associated with one or more material dispense areas 124 associated with a segment, and/or other material dispense attributes associated with a segment. As a non-limiting example, for a particular segment at which the machine 102 is to spray water from one or more material dispensers 118, the route data 146 can include indications of spray rates, spray directions, spray patterns, and/or other data indicating amounts of water to be sprayed by the machine 102.

The dispatch controller 110 and/or the ECM 132 can select or generate the route 108 for the machine 102 in part by determining the expected energy consumption level 112 associated with the route 108. The expected energy consumption level 112 associated with the route 108 can be a combination of a material dispense energy consumption level 152 associated with the route 108 and a travel energy consumption level 154 associated with the route 108.

The material dispense energy consumption level 152 associated with the route 108 can be determined based on energy predicted to be consumed by the material dispensers 118 to dispense material 106 at the material dispense areas 124 associated with the route 108. The material dispense energy consumption level 152 can be determined based on indications in the route data 146 and/or the site map 144 of material dispense rates, directions, patterns, and/or other information associated with material dispense areas 124 that correspond with segments 114 of the route 108. For example, the material dispensers 118 can consume different amounts of energy based on a number of spray heads in use, an amount of fluid to be dispensed by each spray head, widths of fluid to be sprayed, a spray rate, amounts of energy used by fluid delivery pumps to pump fluid to spray heads, energy used for control valve adjustments, and/or other factors.

As an example, if material dispense areas 124 are on both sides of a first segment, but are only on one side of a second segment, the first segment can be associated with a higher material dispense energy consumption level than the second segment because material dispensers 118 on one side of the machine 102 may be inactive during travel through the second segment. As another example, if material dispense areas 124 associated with different segments are associated with different material dispense rates, segments that have higher material dispense rates can be associated with higher material dispense energy consumption levels than segments with lower material dispense rates.

As discussed further below with respect to FIG. 2, the dispatch controller 110 and/or the ECM 132 can determine material dispense energy consumption levels associated with individual segments 114 of the route 108. The dispatch controller 110 and/or the ECM 132 can also determine the overall material dispense energy consumption level 152 associated with the route 108, based on a combination of the material dispense energy consumption levels associated with the individual segments 114.

The travel energy consumption level 154 associated with the route 108 can be determined based on energy expected to be consumed by, and energy expected to be captured during, operations of the machine 102 while traveling along the route 108. For example, electric motors and other electric components of the machine 102 can consume energy to propel travel through some portions of the route 108, while a regenerative braking system can capture energy while braking or decelerating through other portions of the route 108. Accordingly, the dispatch controller 110 and/or the ECM 132 can determine the travel energy consumption level 154 associated with the route 108 based on a combination of travel energy consumption levels associated with individual segments 114 of the route.

The dispatch controller 110 and/or the ECM 132 can determine travel energy consumption levels associated with individual segments 114 of the route 108. Travel energy consumption levels associated with individual segments 114 can be positive or negative. For example, a segment can be associated with a positive travel energy consumption level if the segment has an uphill grade and electric components of the machine 102 would consume energy to propel the machine 102 uphill through the segment. As another example, a segment can be associated with a negative travel energy consumption level if the segment has a downhill grade and a regenerative braking system would capture energy and/or charge the battery 104 as the machine 102 brakes to control its speed while traveling downhill through the segment.

The travel energy consumption levels for individual segments can be determined by the dispatch controller 110 and/or the ECM 132 based on a model of the machine 102 that indicates a size of the machine 102, a weight of the machine 102, and/or other attributes of the machine 102. The expected energy consumption level 112 can also be determined by the dispatch controller 110 and/or the ECM 132 based on physics models, machine learning models, or other models indicating amounts of energy likely to be consumed and/or captured based on grades and/or distances of the segments 114, changes to the amount and/or weight of material 106 stored in the material container 116 at different segments 114 as the machine 102 travels through the route 108 and dispenses material 106 at material dispense areas 124, and/or other attributes.

For example, the travel energy consumption levels can be determined by a machine learning model that has been trained on historical data indicating energy consumption levels associated with traversal of terrain by the machine 102 or similar machines through segments 114 associated with one or more grades and/or distances, energy consumption levels associated with changing amounts and weights of material 106 carried and dispensed by such machines, and/or energy consumption levels associated with other variables. The machine leaning model can accordingly be trained, based on the historical data, to predict energy consumption levels associated with travel of the machine 102 based on amounts and/or weights of material 106 carried by the machine 102, predicted changes to the amounts and/or weights of material 106 as the machine 102 dispenses material 106 during travel, slopes, distances, and/or other attributes of terrain to be traversed, and/or other factors.

As discussed above, the travel energy consumption levels associated with different segments 114 of the route 108 can vary based on differing amounts and/or weights of material 106 carried in the material container 116 through the different segments 114. For example, when the material container 116 is filled with material 106 at the material refill station 122, the amount and/or weight of the material 106 can be relatively high and thereby cause the machine 102 to consume relatively high amounts of energy to propel travel of the machine 102 along the route 108. However, as the machine 102 dispenses material 106 through the material dispensers 118 while traveling along the route 108, the amount of the material 106 stored in the material container 116 can progressively decrease. As the amount of the material 106 stored in the material container 116 decreases, the weight of the payload carried by the machine 102 can decrease, and thereby decrease the amount of energy the machine 102 consumes to propel travel of the machine 102 along remaining portions of the route 108.

As another example, the machine 102 can consume a particular amount of energy while traveling through a first uphill segment near the beginning of the route 108 when the material container 116 is relatively full of the material 106. However, after the machine 102 has dispensed material 106 throughout portions of the route 108 and enters a second uphill segment that has a similar grade as the first uphill segment, the machine 102 may consume less than the particular amount of energy to travel through the second uphill segment, because the machine 102 is carrying a decreased amount of material 106 through the second uphill segment relative to the first uphill segment.

In some examples, an amount of material 106 to be received by the machine 102 at the material refill station 122 can be determined by the dispatch controller 110 and/or the ECM 132, such that the material container 116 is not overfilled with an amount of material 106 that is significantly beyond an amount of material 106 predicted to be dispensed during remaining portions of the route 108. The amount and/or weight of the payload carried by the machine 102 can therefore be reduced, relative to completely filling the material container 116 with material 106 at the material refill station 122. Accordingly, by reducing the amount and/or weight of material 106 provided to the machine 102 at the material refill station 122, the predicted travel energy consumption levels associated with following segments 114 of the route 108 can also be reduced.

Overall, the dispatch controller 110 and/or the ECM 132 can predict, estimate, or determine material dispense energy consumption levels and travel energy consumption levels for the machine 102 in association with individual segments 114 of the route 108. For instance, the dispatch controller 110 and/or the ECM 132 can project decreases in the amount and/or weight of the material 106 carried by the machine 102 throughout the route 108, and determine how changes to the amount and/or weight of the material 106 carried by the machine 102 at different segments 114 impact the material dispense energy consumption levels and travel energy consumption levels associated with individual segments 114. The dispatch controller 110 and/or the ECM 132 can also determine the overall material dispense energy consumption level 152 and the overall travel energy consumption level 154 associated with the entire route 108 for the machine 102 by totaling the material dispense energy consumption levels and travel energy consumption levels determined for the individual segments 114. The dispatch controller 110 and/or the ECM 132 can also determine the expected energy consumption level 112 associated with the route 108 for the machine 102 by totaling the material dispense energy consumption level 152 and the travel energy consumption level 154 associated with the route 108.

In some examples, the dispatch controller 110 and/or the ECM 132 can also determine the material dispense energy consumption level 152 and/or the travel energy consumption level 154 associated with the route 108 based in part on conditions of the machine 102, an age of the machine 102, a number of hours the machine 102 has been operated, environmental conditions, battery SoH information, and/or other additional factors. For example, if the machine 102 is relatively old or has not been maintained recently, components of the machine 102 may consume more energy during traversal of the route 108 or while dispensing material 106 than if the machine 102 is newer or has recently been maintained. As another example, if battery SoH information provided by battery SoH sensors of the machine 102 indicate that the SoC of the battery 104 drains more quickly than average, the dispatch controller 110 and/or the ECM 132 may increase the determined energy consumption level 152 and/or the travel energy consumption level 154 to account for the SoC drain rate indicated by the battery SoH sensors. In some examples, the machine 102 can transmit sensor data determined or measured by sensors 134 to the dispatch controller 110, such that the dispatch controller 110 can use the sensor data, machines conditions, environmental conditions, battery SoH information, and/or other information indicated by the sensor data to determine the material dispense energy consumption level 152 and/or the travel energy consumption level 154 associated with the route 108.

The dispatch controller 110 and/or the ECM 132 can determine the expected energy consumption level 112, including the material dispense energy consumption level 152 and the travel energy consumption level 154, associated with the route 108 and the machine 102, as discussed above. The dispatch controller 110 and/or the ECM 132 can similarly use route data 146 associated with the route 108 to determine a total amount of material 106 to be dispensed along the route 108 by the machine 102. The dispatch controller 110 and/or the ECM 132 can accordingly determine whether the machine 102 can be assigned to traverse the route 108 based on the expected energy consumption level 112 associated with the route 108 and/or the total amount of material 106 to be dispensed along the route 108.

For example, the dispatch controller 110 and/or the ECM 132 can determine that the machine 102 can traverse the route 108 if the current SoC 140 of the battery 104 exceeds the expected energy consumption level 112 associated with the route 108. In some examples, the dispatch controller 110 and/or the ECM 132 can also determine that the machine 102 can traverse the route 108 if the current SoC 140 is sufficient to allow the machine 102 to reach the charging station 120, and/or trolley lines or other charging stations, along the route 108 to charge the battery 104 to an SoC sufficient to power operations of the machine 102 during remaining portions of the route 108. The dispatch controller 110 and/or the ECM 132 can determine and/or predict the SoC to which the battery 104 should be charged when connected to the charging station 120 or other external power sources, times it will take to charge the battery 104 at external power sources, times it will take the machine 102 to travel to the external power sources, wait times the machine 102 may be waiting in queues before being charged at the external power sources, and/or other delays associated with charging the battery 104 while generating the route 108 and/or determining whether the machine 102 can traverse the route 108.

Similarly, the dispatch controller 110 and/or the ECM 132 can determine that the machine 102 can traverse the route 108 if the payload data 138 indicates that a current amount of material 106 carried by the machine 102 exceeds the total amount of material 106 to be dispensed along the route 108. In some examples, the dispatch controller 110 and/or the ECM 132 can also determine that the machine 102 can traverse the route 108 if the route 108 would take the machine 102 to the material refill station 122, and/or one or more other material refill stations, where the material container 116 can be refilled with an amount of additional material 106 sufficient to allow the machine 102 to dispense material 106 at material dispense areas 124 along remaining portions of the route 108. The dispatch controller 110 and/or the ECM 132 can also determine and/or predict amounts of additional material 106 the machine 102 should receive at material refill stations, such as specific amounts of material 106 to be dispensed along remaining portions or the route 108 and/or until the machine 102 reaches a next material refill station. The dispatch controller 110 and/or the ECM 132 can additionally determine times it will take to fill the material container 116 with the additional material 106 at the material refill stations, times it will take the machine 102 to travel to the material refill stations, wait times the machine 102 may be waiting in queues before being filled with material 106 at the material refill stations, and/or other delays associated with filling the material container 116 with material 106 while generating the route 108 and/or determining whether the machine 102 can traverse the route 108.

If the dispatch controller 110 and/or the ECM 132 determines that the machine 102 can be assigned to traverse the route 108, for instance because the current SoC 140 exceeds the expected energy consumption level 112 associated with the route 108 and the current amount of material 106 carried by the machine 102 exceeds the total amount of material 106 to be dispensed along the route 108, the dispatch controller 110 and/or the ECM 132 can generate a route assignment 156. The dispatch controller 110 can transmit the route assignment 156 to the machine 102, and/or the ECM 132 can cause the machine 102 to follow the route assignment 156. The route assignment 156 can include information associated with the route 108, such as coordinates of the path of the route 108, material dispense rates associated with the material dispense areas 124, material dispense patterns associated with the material dispense areas 124, and/or other information associated with the route 108.

If the machine 102 is an autonomous or semi-autonomous machine, the route assignment 156 can include instructions that the ECM 132 can follow to cause the machine 102 to automatically travel along the route 108. In these examples, the route assignment 156 can also, or alternately, include instructions that the ECM 132 can use to automatically operate the material dispensers 118 to dispense material 106 at the material dispense areas 124 according to dispense rates, patterns, directions, and/or other information indicated by the route assignment 156. For instance, if the machine 102 is autonomous, the route assignment 156 can include autonomous machine instructions that cause the machine 102 to automatically drive through the route 108 and to automatically dispense material 106 at material dispense areas 124. If the machine 102 is semi-autonomous, the route assignment 156 can include machine instructions that cause the machine 102 to automatically dispense material 106 at material dispense areas 124 while a human operator drives the machine 102, or machine instructions that cause the machine 102 to automatically drive through the route 108 while a human operator controls the material dispensers 118 to dispense material 106 at material dispense areas 124 based on other information in the route assignment 156.

In other examples, the route assignment 156 can include information that causes a screen, speakers, and/or other systems of the machine 102 to present navigation instructions associated with traversal of the route 108 to a driver of the machine 102. In these examples, the route assignment 156 can also, or alternately, include information that causes a screen, speakers, or other systems of the machine 102 to present information associated with material dispense areas 124 to the driver or other operator of the machine 102, such as instructions to dispense material 106 at indicated material dispense rates and/or patterns, towards indicated directions, at material dispense areas 124 along the route 108. In some examples, a screen, speakers, or other systems of the machine 102 can also indicate other information to a driver or other operator, such as the current SoC 140, a current amount and/or weight of material 106 stored in the material container 116, an amount of material 106 to receive at a material refill station, and/or other information associated with operations of the machine 102.

If the dispatch controller 110 and/or the ECM 132 determines that the machine 102 cannot be assigned to traverse the route 108, for instance because the current SoC 140 does not exceed the expected energy consumption level 112 associated with the route 108 and/or the current amount of material 106 carried by the machine 102 does not exceed the total amount of material 106 to be dispensed along the route 108, the dispatch controller 110 can modify the route 108 or select or generate a different route for the machine 102. As an example, if the dispatch controller 110 determines that the current SoC 140 does not exceed the expected energy consumption level 112 associated with the route 108, the dispatch controller 110 can modify the route 108 to include a visit to the charging station 120 so that the machine 102 can increase the SoC of the battery 104 during the route 108 to a level that would power the machine 102 through remaining portions of the route 108. As another example, if the dispatch controller 110 determines that the current amount of material 106 carried by the machine 102 does not exceed the total amount of material 106 to be dispensed along the route 108, the dispatch controller 110 can modify the route 108 to include a visit to the material refill station 122 to receive an additional amount of material 106.

Alternatively, if the dispatch controller 110 and/or the ECM 132 determines that the current SoC 140 of the battery 104 of the machine 102 does not exceed the expected energy consumption level 112 associated with the route 108, the dispatch controller 110 and/or the ECM 132 can select a different route for the machine 102. For example, the current SoC 140 of the battery 104 may be lower than an expected energy consumption level 112 associated with a longer route that partially extends along the first road 148. However, the current SoC 140 of the battery 104 may be higher than an expected energy consumption level 112 associated with a shorter route that partially extends along the second road 150 instead of the first road 148. In this example, the dispatch controller 110 and/or the ECM 132 can determine to assign the machine 102 to the shorter route instead of the longer route, and send the machine 102 the route assignment 156 to dispatch the machine 102 to traverse the shorter route.

In other examples, if the dispatch controller 110 and/or the ECM 132 determines that the current SoC 140 of the battery 104 of the machine 102 does not exceed the expected energy consumption level 112 associated with the route 108, the dispatch controller 110 and/or the ECM 132 can modify machine operations associated with the route 108. For example, the dispatch controller 110 can determine that the machine 102 should dispense material 106 at a subset of the material dispense areas 124 along the route 108, or should dispense material 106 at the material dispense areas 124 using a different material dispense rate and/or pattern, in order to decrease the material dispense energy consumption level 152 associated with the route 108 and lower the overall expected energy consumption level 112 to below the current SoC 140 of the battery 104.

The dispatch controller 110 can perform fleet management operations to assign different machines to traverse different routes on the worksite 100. For example, if the dispatch controller 110 and/or the ECM 132 determines that the current SoC 140 of the battery 104 of the machine 102 does not exceed the expected energy consumption level 112 associated with the longer route that extends along the first road 148, the dispatch controller 110 can assign the machine 102 to the shorter route that extends along the second road 150 as discussed above. The dispatch controller 110 can determine that a second machine has a higher current SoC that exceeds the expected energy consumption level 112 associated with the longer route, and can accordingly assign that second machine to traverse the longer route at the same time, or at a different time, that the machine 102 traverses the shorter route. As another example, if the dispatch controller 110 determines that the machine 102 is more energy efficient than one or more other machines in a fleet, the dispatch controller 110 can assign the machine 102 to routes more often than other machines, or may prioritize assigning the machine 102 to longer routes or routes that may be associated with higher expected energy consumption levels. Accordingly, the dispatch controller 110 can assign different machines to different routes, and thus cause different machines to dispense material 106 at different sets of material dispense areas associated with the different routes. In some examples, the dispatch controller 110 can also consider other data during fleet management operations, for instance by using location data indicating locations of the machine 102 and/or other machines and/or other information to select routes for different machines that may minimize traffic delays on the worksite 100.

The dispatch controller 110 can, in some examples, have a user interface configured to display information associated with the worksite 100. For example, the user interface can display information associated with individual machines and/or sets of machines on the worksite 100, such as locations of the machines, current and/or historical SoC levels associated with the machines, current and/or historical material fill levels associated with the machines, and/or other information. The user interface can, in some examples, color-code or certain highlight information, for instance by using red to show low SoC and/or material fill levels associated with machines, yellow to show medium SoC and/or material fill levels associated with machines, and green to show high SoC and/or material fill levels associated with machines. The user interface of the dispatch controller 110 can also, in some examples, indicate routes that are currently assigned to individual machines, projected times for machines to traverse assigned routes, projected times for machines to reach material refill stations, charging stations, or other locations, routes that are available to assign to machines, information associated with current and/or historical conditions of material dispense areas 124, and/or other information.

The dispatch controller 110 can also, in some examples, determine and/or display cost estimates, efficiency metrics, and/or other information associated with fleet management on the worksite 100. For example, based on assignments of machines to routes, actual or projected amounts of material 106 loaded and dispensed in association with the routes, actual or projected amounts of energy to be consumed by the machines and/or provided to the machines at charging stations, the dispatch controller 110 can display cost totals or projected cost estimates associated with the routes. In some cases, the dispatch controller 110 or a user of the dispatch controller 110 can assign machines to routes, or adjust routes and/or corresponding material dispense patterns or rates, based on such cost estimates. For instance, if projected cost estimates exceed a monthly budget, a site manager may choose to assign fewer machines to routes, or assign fewer routes to machines, to lower the projected costs.

The dispatch controller 110 and/or the ECM 132 can also be configured to generate routes to optimize efficiency and/or lower costs with respect to the machine 102 and/or other machines. For example, the dispatch controller 110 and/or the ECM 132 can plan or adjust the route 108 in a way that lowers the overall expected energy consumption level 112 associated with the route 108 and/or increases efficiency on the worksite 100. For instance, the dispatch controller 110 and/or the ECM 132 can deprioritize uphill segments, where the machine 102 would consume relatively high amounts of energy, during early portions of the route 108 when the machine 102 may be projected to be carrying more material 106 than during later portions of the route 108. The dispatch controller 110 and/or the ECM 132 can also plan or adjust the path of the route 108 to avoid high-traffic areas on the worksite 100 and/or reach material dispense areas 124 more quickly, cause the machine 102 to fill the material container 116 only with amounts of material 106 predicted to be used during subsequent portions of the route 108, adjust material dispense rates and/or patterns to dispense higher amounts of material 106 during early portions of the route 108, and/or otherwise optimize the path of the route 108 and/or machine operations during the route 108.

In some examples, after the machine 102 has embarked along the route 108 according to the route assignment 156, the dispatch controller 110 and/or the ECM 132 can dynamically adjust the route 108, and/or operations of the machine 102 to be performed along the route 108. For example, the dispatch controller 110 and/or the ECM 132 can track the current SoC 140 of the battery 104 as the machine 102 travels along the route 108, and use payload data 138 to track a progressively decreasing amount of material 106 stored in the material container 116 as the machine 102 travels along the route 108 and dispenses material 106 at material dispense areas 124. The dispatch controller 110 and/or the ECM 132 can also generate updated values for the expected energy consumption level 112 associated with remaining portions of the route 108, and/or updated values of the amount of material 106 to be dispensed along remaining portions of the route 108. If such updated values indicate that the machine 102 does not have enough SoC and/or material 106 to finish the route 108, the dispatch controller 110 and/or the ECM 132 can dynamically adjust remaining portions of the route 108.

As an example, delays caused by other machines or obstacles on the path of the route 108 may cause the machine 102 to idle at a stationary position on the route 108 for a period of time. For instance, if the dispatch controller 110 and/or the ECM 132 determines that the machine 102 has been assigned to dispense material 106 at certain material dispense areas 124 along a route 108, but location data or machine-to-machine data associated with another machine indicates that the machines will pass each other while one or both of the machines are dispensing material, the dispatch controller 110 and/or the ECM 132 can cause the machine 102 to stop and turn off the material dispensers 118 until the other machine 102 passes by. The machine 102 may similarly stop and/or turn off the material dispensers 118 due to traffic or other conditions on the worksite 100.

In such situations, the machine 102 may attempt to preserve SoC of the battery 104 by shutting off one or more material dispensers 118 while the machine 102 is idling, but the idling may discharge the battery 104 such that an updated value of the current SoC 140 falls below an updated value for the expected energy consumption level 112 associated with remaining portions of the route 108. In this situation, the dispatch controller 110 and/or the ECM 132 can modify the route 108 to include a detour to the charging station 120 to increase the SoC of the battery 104 to a level that exceeds the expected energy consumption level 112 associated with remaining portions of the route 108. Alternatively, the dispatch controller 110 and/or the ECM 132 can adjust the route 108 and/or machine operations along the route 108 to skip dispensing material 106 at one or more material dispense areas 124 along the remaining portions of the route 108, or to dispense material 106 at lower dispense rates or less-energy intensive dispense patterns, to decrease the expected energy consumption level 112 associated with remaining portions of the route 108 to a level below the updated value of the current SoC 140.

In some examples, the dispatch controller 110 and/or the ECM 132 can instead determine that the machine 102 should dispense more material 106 than originally planned at one or more material dispense areas 124 or other areas along the route 108, to more quickly decrease the amount of material 106 carried by the machine 102 and thereby reduce travel energy consumption levels associated with remaining portions of the route 108. For instance, if lowering the weight of the material 106 carried by the machine 102 would result in a decrease in the travel energy consumption levels associated with upcoming segments 114 of the route 108, and the decrease in the travel energy consumption levels more than offsets an increase in the material dispense energy consumption level 152 associated with dispensing material 106 more quickly, the decrease in the travel energy consumption levels may reduce the overall expected energy consumption level 112 associated with remaining portions of the route 108 to a level below the updated value of the current SoC 140.

Overall, the dispatch controller 110 and/or the ECM 132 can determine the expected energy consumption level 112 associated with the route 108 and the machine 102, to verify that the battery 104 of the machine 102 has a current SoC, or can be charged along the route to a designated SoC, sufficient to power travel operations and material dispense operations along the route 108. Because the machine 102 can be assigned to dispense material 106 along the route 108, and an amount of the material 106 carried by the machine 102 can accordingly decrease throughout the route 108, the expected energy consumption level 112 can be determined, at least in part, on decreasing amounts of material 106 predicted to be carried by the machine 102 at different segments 114 of the route 108. In some examples, if the dispatch controller 110 and/or the ECM 132 determines that a potential route for the machine 102 has an expected energy consumption level 112 that exceeds the current SoC 140 of the battery 104 of the machine 102, the dispatch controller 110 and/or the ECM 132 can adjust the route 108 or select an alternate route for the machine 102 so that the machine 102 increases the SoC of its battery 104 or is assigned a route that has an expected energy consumption level that is lower than the SoC of its battery 104. The dispatch controller 110 can also assign different machines to different routes based on the SoC of each of the batteries of the machines and expected energy consumption levels associated with the different routes, such that the different machines can be assigned to dispense material 106 to different sets of material dispense areas 124 associated with the different routes.

Figure 2:
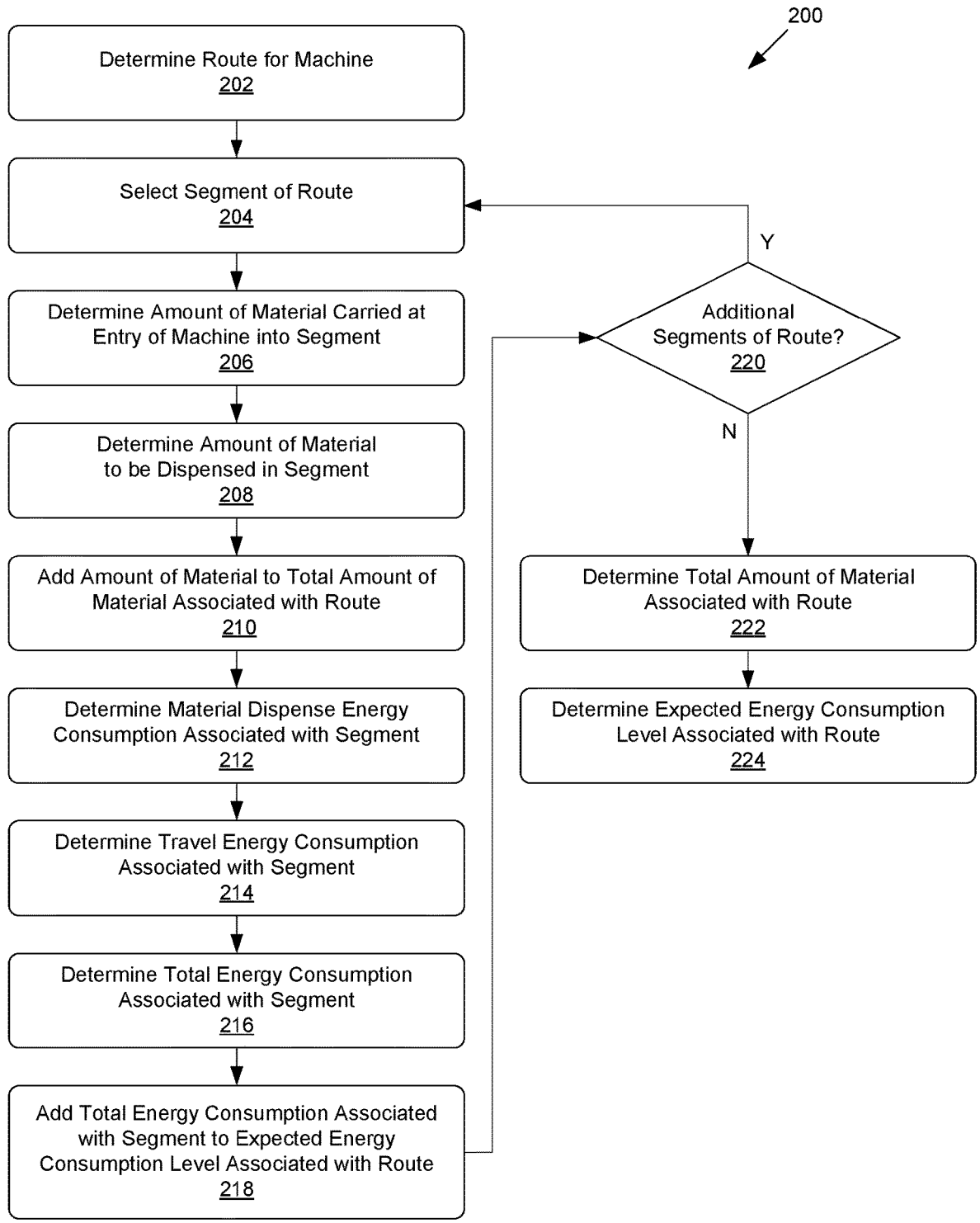
FIG. 2 shows a flowchart illustrating an example process for determining attributes of a route for the machine.
Figure 4:
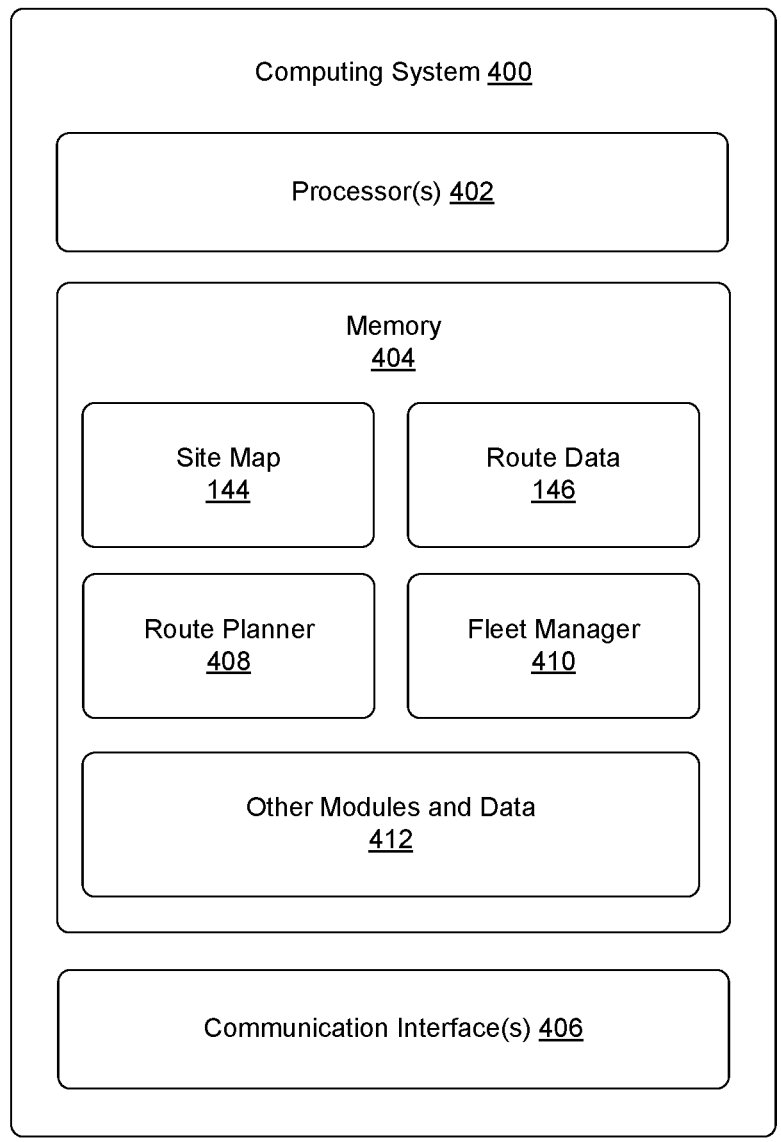
FIG. 4 shows an example system architecture for a computing system.

FIG. 2 shows a flowchart 200 illustrating an example process for determining attributes of the route 108 for the machine 102, including the expected energy consumption level 112 associated with the route 108 and an amount of material 106 to be dispensed along the route 108. The operations shown in FIG. 2 can be performed by a system that includes the dispatch controller 110 and/or the ECM 132. An example architecture of a computing system associated with the dispatch controller 110 and/or the ECM 132 is shown in FIG. 4, and is described below with respect to that figure.

At block 202, the system can determine the route 108 for the machine 102. In some examples, the system can have a set of predetermined routes, and can select one of the predetermined routes for the machine at block 202. For instance, if material 106 has not been dispensed at material dispense areas 124 along one of the predetermined routes for at least a threshold amount of time, the system can select that predetermined route for the machine 102 at block 202. As another example, the system can determine that material 106 is to be dispensed at a set of material dispense areas 124, and the system can generate a new route at block 202 that passes by or through those material dispense areas 124.

At block 204, the system can select a segment of the route 108 determined at block 202. The route 108 can be divided into multiple segments 114. A segment can extend through a portion of the route 108 that has a same or similar grade, a same or similar heading, a same or similar material dispense rate and/or pattern, and/or any other common attributes. For instance, segments 114 of the route 108 can be divided at points along the route 108 based on grade changes, locations of intersections, differing material dispense rates, and/or other varying attributes. Although the system can select a particular segment of the route 108 at block 204, the system can return to block 204 multiple times to select different segments 114 of the route 108, as discussed further below.

At block 206, the system can determine an amount of material 106 that will be carried by the machine 102 upon entry into the segment selected at block 204. For example, based on payload data 138 indicting a current amount and/or weight of material 106 carried by the machine 102 and/or based on predictions or estimates of amounts of material 106 that will have been dispensed by the machine 102 in preceding segments and/or that will have been added at one or more material refill stations prior to entry into the selected segment, the system can predict or estimate how much material 106 the machine 102 will be carrying when the machine 102 enters the segment. In some examples, the system can generate the route 108 to include visits to one or more material dispense locations, and can indicate how much material 106 should be provided to the machine during those visits to the material dispense locations. Accordingly, in these examples, the system can determine how much material 106 the machine 102 will be carrying upon entry into the segment based on amounts of material 106 that will have been provided to the machine 102 at the material dispense locations before the machine 102 reaches the segment, and/or predicted amounts of material 106 that will have been dispensed after visits to the material dispense locations and before entry into the segment of the route 108.

At block 208, the system can determine an amount of material 106 to be dispensed in the segment. For example, the route data 146 can indicate information associated with material dispense areas 124 at or along the segment. If zero material dispense areas 124 are associated with the segment, the amount of material 106 to be dispensed in the segment can be zero. However, if the route data 146 indicates that one or more material dispense areas 124 are associated with the segment, the route data 146 can also indicate material dispense rates, material dispense patterns, material dispense directions, and/or other material dispense attributes associated with the segment. The system can accordingly determine how much material 106 is to be dispensed by the machine 102 as the machine 102 travels through the segment.

Determining the amount of material 106 to be dispensed in the segment at block 208 can also allow the system to determine how much material 106 the machine 102 will be carrying when the machine 102 leaves the segment and enters the next segment, which the system can consider at block 206 for the next segment. Determining the amount of material 106 to be dispensed in the segment at block 208 can also allow the system to determine a rate at which the weight of the material 106 carried by the machine 102 decreases through the segment, and/or amounts of the material 106 carried by the machine 102 at one or more points within the segment. For example, the system can use material dispense rates and/or patterns associated with the segment to determine how the amount and/or weight of the material 106 carried by the machine 102 is projected to change throughout travel of the machine 102 at various locations throughout the segment.

At block 210, the system can add the amount of material 106 to be dispensed in the segment, determined at block 208, to a total amount of material 106 to be dispensed along the entire route 108. For example, the system can maintain a counter of the total amount of material 106 to be dispensed along the entire route 108, and can increment the counter by amounts of material that the system determines are to be dispensed at individual segments 114 of the route 108 during each iteration through blocks 208 and 210.

At block 212, the system can determine a material dispense energy consumption level associated with the segment. For example, the system can predict or estimate an amount of energy the machine 102 would consume to operate one or more material dispensers 118 to dispense the amount of material 106 determined at block 208 at the segment. In some examples, the material dispense energy consumption level associated with the segment can be determined based on material dispense rates, patterns, directions, or other material dispense attributes associated with the segment. For instance, if the segment is associated with material dispense areas 124 on both sides of the segment and route data 146 indicates that water is to be sprayed on the material dispense areas 124 at a relatively high flow rate using a selected spray pattern, the material dispense energy consumption level associated with the segment can be higher than if the segment had material dispense areas 124 on only one side of the segment and/or if the route data 146 indicates that water is to be sprayed on the material dispense areas 124 at a relatively low flow rate or with a different spray pattern associated with lower energy consumption.

At block 214, the system can determine a travel energy consumption level associated with the segment. For example, based on a length and grade of the segment indicated by the site map 144 and/or the route data 146, the system can determine whether the machine 102 will likely need to brake while traveling through the segment, accelerate through the segment, and/or perform other operations to traverse the segment. The system can accordingly determine whether the machine 102 will consume a positive amount of energy to travel through the segment, or will consume a negative amount of energy to travel through the segment because a regenerative braking system is predicted to capture energy and/or charge the battery 104 as the machine 102 brakes or decelerates through the segment.

As discussed above, the amount of material 106 carried by the machine 102 can change as the machine 102 progresses through the route 108 and dispenses material 106 from the material container 116 to material dispense areas 124. Accordingly, at block 214, the system can determine a travel energy consumption level associated with the segment based at least in part on the amount of material 106 that will be carried by the machine 102 upon entry into the segment (determined at block 206), the amount of material 106 to be dispensed in the segment (determined at block 208), and/or changes to the weight and/or amount of material 106 carried by the machine 102 throughout the segment. For example, the system can determine that the machine 102 will consume a relatively high amount of energy to travel through the segment if the machine 102 is projected to be carrying a relatively high amount of material 106 through the segment, but may determine that the machine 102 will consume a lower amount of energy to travel through the segment if the machine 102 is projected to be carrying a lower amount of material 106 through the segment. As another example, the system can determine that the weight of the material 106 carried by the machine 102 will decrease at a particular rate, or at variable rates, as the machine 102 progresses through the segment, and can accordingly determine the travel energy consumption level associated with the segment based on projected changes to the weight of the material 106 carried by the machine 102 throughout the segment.

At block 216, the system can determine a total energy consumption level associated with the segment, based on a total of the material dispense energy consumption level associated with the segment (determined at block 212) and based on the travel energy consumption level associated with the segment (determined at block 214). For instance, the system can determine at block 212 that the material dispensers 118 will consume a first amount of energy to dispense an amount of material 106 in the segment. The system can also determine at block 214 that a second amount of energy will be consumed or captured based on travel of the machine 102 through the segment, based at least in part on an amount of material 106 projected to be carried by the machine 102 through the segment. The total energy consumption level associated with the segment can accordingly be based on a sum of the first amount of energy and the second amount of energy. In some examples, if the travel energy consumption level associated with the segment is a negative value, for instance if energy is projected to be captured by regenerative braking during travel through the segment, the total energy consumption level associated with the segment can be a negative value.

At block 218, the system can add the total energy consumption level associated with the segment, determined at block 216, to a value of the expected energy consumption level 112 associated with the route 108 overall. For example, the system can maintain a counter of the expected energy consumption level 112 associated with the route 108, and can increment or decrement the counter by total energy consumption levels associated with individual segments 114 of the route 108 during each iteration through blocks 216 and 218.

At block 220, the system can determine if any additional segments 114 of the route 108 have not yet been evaluated according to the operations of blocks 204 through 218. If additional segments 114 of the route 108 are to be evaluated (Block 220—Yes), the system can return to block 204 to select another segment, and can evaluate that segment at blocks 206 through 218. In some examples, the system can use a first loop through blocks 202 through 218 to evaluate a first segment of the route 108 closest to the current location of the machine 102, and evaluate subsequent segments 114 of the route 108 during subsequent loops through blocks 202 through 218 until all of the segments 114 of the route 108 have been evaluated.

If no additional segments 114 of the route 108 are to be evaluated (Block 220—No), the system can determine the final total amount of material 106 associated with the route 108 at block 222 and can determine the final expected energy consumption level 112 associated with the route 108 at block 224. As discussed above, the system can maintain counter values associated with the amount of material 106 associated with the route 108 and the expected energy consumption level 112 associated with the route 108, and can adjust those counter values during each iteration through block 210 and block 218. Accordingly, at block 222 and block 224 the dispatch controller can determine final values of the counters after all of the segments 114 of the route 108 have been evaluated using the operations of blocks 206 through 218.

Accordingly, the system can use the process shown in FIG. 2 to determine the overall amount of material 106 to be dispensed along the route 108, and the overall expected energy consumption level 112 associated with the route 108. The system can use this information, for instance as discussed below with respect to FIG. 3, to determine whether the machine 102 can be assigned to the route 108, whether the route 108 should be adjusted, or whether the machine 102 should be assigned to a different route.

For example, if the current SoC 140 of the battery 104 of the machine 102 is less than the overall expected energy consumption level 112 associated with the route 108, the system may determine that the machine 102 should be assigned to a different route, or may adjust the route to include a detour to the charging station 120 so that the SoC of the battery 104 can be increased to a level that exceeds the overall expected energy consumption level 112 associated with a remainder of the adjusted route. As another example, if the current SoC 140 of the battery 104 of the machine 102 is less than the overall expected energy consumption level 112 associated with the route 108, the system can decrease the expected energy consumption level 112 by adjusting machine operations associated with the route 108. For instance, the system can adjust material dispense rates and/or patterns associated with the route 108, adjust a number of material dispense areas 124 along the route 108 at which material 106 is to be dispersed, prioritize dispersal of material 106 at some material dispense areas 124 over other material dispense areas 124 based on dust sensor data or other information, and/or otherwise adjust machine operations to lower the overall expected energy consumption level 112 associated with the route 108.

In some examples, the system can also use the process shown of FIG. 2 after the machine 102 has begun traversing the route 108. For instance, after the machine 102 begins traversing the route 108, the system can use the process shown in FIG. 2 to determine, based on updated information such as updated location data 136, updated payload data 138, and/or an updated current SoC 140, an updated amount of material 106 to be dispensed along remaining portions of the route 108 and/or an updated expected energy consumption level associated with remaining portions of the route 108.

Figure 3:
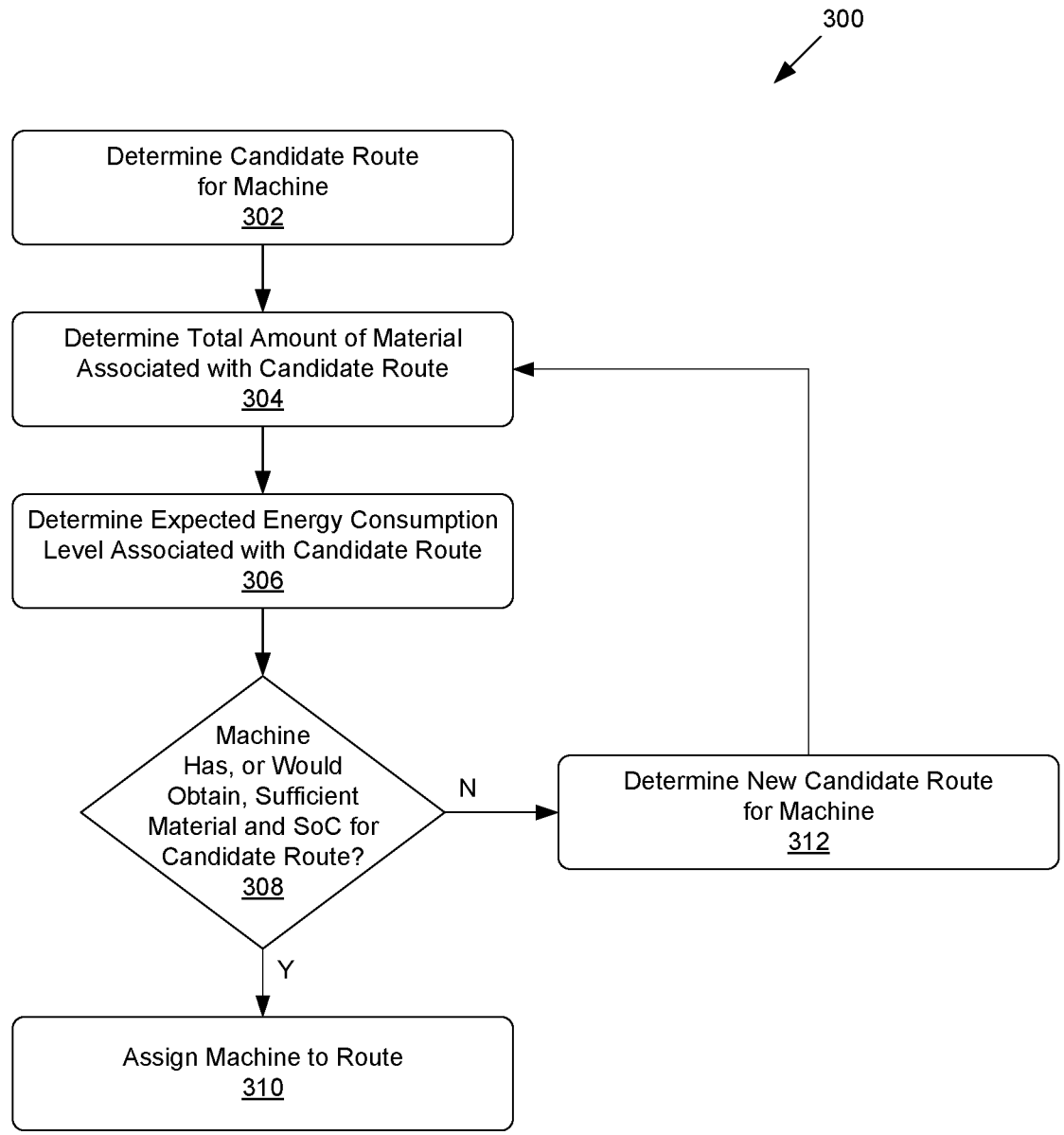
FIG. 3 shows a flowchart illustrating an example process for assigning a route to the machine.

FIG. 3 shows a flowchart 300 illustrating an example process for assigning a route to the machine 102. The operations shown in FIG. 3 can be performed by a system that includes the dispatch controller 110 and/or the ECM 132. An example architecture of a system associated with the dispatch controller 110 and/or the ECM 132 is shown in FIG. 4, and is described below with respect to that figure.

At block 302, the system can determine a candidate route for the machine 102. In some examples, the system can determine the candidate route by selecting a route from a set of available routes. For instance, the route data 146 can indicate a set of different routes associated with different sets of material dispense areas 124 that are due to receive material 106, and the system can select a route from the set of available routes for possible assignment to the machine 102. In some examples, the system can at least partially modify the selected candidate route at block 302. For instance, the system can adjust the candidate route to add one or more segments along a path from the current location of the machine 102, indicated by location data 136, to a segment along the selected candidate route, such that the machine 102 can travel to the selected candidate route.

In other examples, the system can generate a new candidate route for the machine 102 at block 302. For example, based on a list of material dispense areas 124 that are due to receive material 106 indicated in the route data 146 or another data source, the current location of the machine 102 indicated by location data 136, and/or the site map 144, the system can generate the candidate route through the worksite 100 for the machine 102. The system can, in some examples, use the site map 144 and/or the route data 146 to determine segments 114 of the candidate route that avoid obstacles on the worksite 100 and extend past selected material dispense areas 124 that are due to receive material 106, determine incline or decline angles of the segments 114, and/or otherwise determine segments 114 of the candidate route.

At block 304, the system can determine the total amount of material 106 associated with the candidate route. The system can use the process described above with respect to FIG. 2 to determine the total amount of material 106 associated with the candidate route. For example, for each segment of the candidate route, the system can determine an amount of material 106 to be dispensed by the machine 102 toward material dispense areas 124 associated with the segment. At block 304, the system can determine the total amount of material 106 associated with the candidate route by totaling the amounts of material 106 associated with the individual segments 114 of the candidate route.

At block 306, the system can determine the expected energy consumption level 112 associated with the candidate route determined at block 302. The system can use the process described above with respect to FIG. 2 to determine the expected energy consumption level 112 associated with the candidate route. For example, for each segment of the candidate route, the system can determine a total energy consumption level associated with the segment by determining and totaling a material dispense energy consumption associated with the segment and a travel energy consumption associated with the segment. The total energy consumption associated with different segments 114 can vary, for instance based on material dispense attributes associated with different segments 114, lengths and/or grades of the different segments 114, a varying amount of material 106 carried by the machine 102 that decreases as the machine 102 progresses through the route and dispenses material 106, and/or other factors. At block 306, the system can determine the overall expected energy consumption level associated with the candidate route by combining the total energy consumption levels associated with the individual segments 114 of the candidate route.

At block 308, the system can determine whether the material container 116 of the machine 102 has a sufficient amount of material 106 to be dispensed along the candidate route. The system can also determine, at block 308, whether the battery 104 of the machine 102 has sufficient SoC to power operations of the machine 102 during travel through the candidate route.

For example, the system can use payload data 138 reported by the machine 102 to determine whether an amount of material 106 currently carried in the material container 116 meets or exceeds the total amount of material 106 associated with the candidate route determined at block 304. If the current amount of material 106 carried by the machine 102 is less than the total amount of material 106 associated with the candidate route determined at block 304, the system can determine whether the machine 102 would receive one or more refills of material 106 at one or more material refill stations while traveling along the candidate route, for instance based on refills of amounts of material 106 determined by the system, and whether such refills of material 106 would allow the machine 102 to dispense material 106 at the material dispense areas 124 along the candidate route as planned without running out of material 106.

As another example, the system can use the current SoC 140 reported by the machine 102 to determine whether the current SoC 140 of the battery 104 of the machine 102 meets or exceeds the expected energy consumption level 112 associated with the candidate route determined at block 306. If the current SoC 140 is less than the expected energy consumption level 112 associated with the candidate route determined at block 306, the system can determine whether the battery 104 would be charged at one or more charging stations while traveling along the candidate route and/or be charged by regenerative braking operations during one or more segments 114 of the candidate route. The system can accordingly determine whether such charges of the battery 104 during travel through the candidate route would allow the machine 102 to dispense material 106 at the material dispense areas 124 and fully traverse the candidate route (and subsequently return to a charging station if the candidate route does not terminate at a charging station) without fully discharging the battery 104 and stranding the machine 102 along the candidate route.

If the system determines that the machine 102 has sufficient material 106 and SoC to travel through the candidate route and dispense material 106 at the material dispense areas 124 associated with the candidate route (or would obtain sufficient material refills and/or sufficiently recharge the battery 104 during travel through the candidate route) (Block 308—Yes), the system can accept the candidate route as the route 108 for the machine 102. The system can accordingly assign the machine 102 to the route 108 at block 310. For example, the dispatch controller 110 can generate the route assignment 156 associated with the route 108, and transmit the route assignment 156 to the machine 102 at block 310. As discussed above, the machine 102 can follow the route assignment 156 to autonomously travel along the route 108 and/or automatically dispense material 106 at the corresponding material dispense areas 124, or can use the route assignment 156 to present navigation instructions and/or material dispense instructions to a driver or other operator of the machine 102.

If the system determines that the machine 102 does not have sufficient material 106 and SoC to travel through the candidate route and dispense material 106 at the material dispense areas 124 associated with the candidate route (or would not obtain sufficient material refills and/or sufficiently recharge the battery 104 during travel through the candidate route) (Block 308—No), the system can generate a new candidate route for the machine 102 at block 312. In some examples, the system can modify the candidate route at block 312 to include one or more visits to charging stations and/or material refill stations, if such visits would allow the machine 102 to obtain sufficient material refills and/or sufficiently recharge the battery 104 during travel through the modified candidate route. In other examples, the system can select a different candidate route from a set of predetermined routes, or generate a different candidate route, at block 310. For example, the different candidate route can have a shorter total length, pass through more downhill segments 114 that would allow the machine 102 to capture more energy using a regenerative braking system, be associated with fewer material dispense areas 124 and/or cause the machine 102 to dispense less material 106 overall, and/or have other differing attributes that may allow the machine 102 to complete travel though the new candidate route.

After determining the new candidate route at block 312, the system can determine the total amount of material 106 associated with the new candidate route at block 304 and the expected energy consumption level 112 associated with the new candidate route at block 306. The system can also determine whether the machine 102 has, or would obtain, sufficient material 106 and SoC for the new candidate route at block 308. If the machine 102 does not have, or would not obtain, sufficient material 106 and SoC for the new candidate route (Block 308—No), the system can determine another new candidate route for the machine 102 at block 312. However, if the machine 102 does have, or would obtain, sufficient material 106 and SoC for the new candidate route (Block 308—Yes), the system can accept the new candidate route as the route 108 for the machine 102, and assign the machine 102 to the route 108 at block 310.

The dispatch controller 110 can use the process of FIG. 3 in association with a fleet of machines. For example, if the dispatch controller 110 has a set of predetermined routes associated with different sets of material dispense areas 124, the dispatch controller 110 can determine which machines, selected from a set of machines that are present on the worksite 100 or are otherwise available to be assigned to routes on the worksite 100, should be assigned to each of the predetermined routes. As an example, if a first battery of a first machine has a higher SoC than a second battery of a second machine, the dispatch controller 110 can determine to assign the first machine to a first route that is longer and/or has fewer downhill sections where the first battery can be recharged via regenerative braking, and assign the second machine to a second route that is shorter and/or has more downhill sections where the second battery can be recharged via regenerative braking.

As another example, if segments 114 of a first route are associated with higher material discharge rates than segments 114 of an otherwise similar second route, the overall weight of the material 106 carried by a machine may decrease more quickly if the machine were to travel through the first route than if the machine were to travel through the second route. Accordingly, the travel energy consumption level 154 and overall expected energy consumption level 112 associated with the first route may be lower than for the second route, due to quicker decreases in the weight of material 106 carried by the machine assigned to the first route. The dispatch controller 110 may, in some examples, assign a first machine with lower current SoC to the first route, and assign a second machine with higher current SoC to the second route, if the dispatch controller 110 projects that the quicker decrease in payload associated with the first route would cause the first route to have a lower overall expected energy consumption level and that the first machine could complete travel through the first route despite the lower current SoC of the first machine.

FIG. 4 shows an example system architecture for a computing system 400. In some examples, the computing system 400 can be the dispatch controller 110 described above, or another server or computer that is remote from the machine 102. In other examples, the computing system 400 can be the ECM 132 or other on-board computing system of the machine 102. In some examples, elements of the computing system 400 can be distributed between the dispatch controller 110 and the machine 102. The computing system 400 can include one or more computing devices or other controllers that include one or more processors 402, memory 404, and communication interfaces 406.

The processor(s) 402 can operate to perform a variety of functions as set forth herein. The processor(s) 402 can include one or more chips, microprocessors, application specific integrated circuits (ASICs), field programmable gate arrays (FPGAs) and/or other programmable circuits, central processing units (CPUs), graphics processing units (GPUs), digital signal processors (DSPs), and/or other processing units or components known in the art. In some examples, the processor(s) 402 can have one or more arithmetic logic units (ALUs) that perform arithmetic and logical operations, and/or one or more control units (CUs) that extract instructions and stored content from processor cache memory, and executes such instructions by calling on the ALUs during program execution. The processor(s) 402 can also access content and computer-executable instructions stored in the memory 404, and execute such computer-executable instructions.

The memory 404 can be volatile and/or non-volatile computer-readable media including integrated or removable memory devices including random-access memory (RAM), read-only memory (ROM), flash memory, a hard drive or other disk drives, a memory card, optical storage, magnetic storage, and/or any other computer-readable media. The computer-readable media can be non-transitory computer-readable media. The computer-readable media can be configured to store computer-executable instructions that can be executed by the processor(s) 402 to perform the operations described herein.

For example, the memory 404 can include a drive unit and/or other elements that include machine-readable media. A machine-readable medium can store one or more sets of instructions, such as software or firmware, that embodies any one or more of the methodologies or functions described herein. The instructions can also reside, completely or at least partially, within the processor(s) 402 and/or communication interface(s) 406 during execution thereof by the computing system 400. For example, the processor(s) 402 can possess local memory, which also can store program modules, program data, and/or one or more operating systems.

In some examples, the memory 404 can store the site map 144, the route data 146, a route planner 408, a fleet manager 410, and/or other modules and data 412. The route planner 408 can be configured to select and/or generate the route 108 for the machine based on amounts of material 106 to be dispensed along the route 108 and the expected energy consumption level 112 associated with the route 108, for instance using the processes shown in FIG. 2 and/or FIG. 3. The fleet manager 410 can be configured to manage data and/or route assignments for a set of machines including the machine 102 and/or other material-dispensing machines associated with the worksite 100. For example, the fleet manager 410 can cause the route planner 408 to select and/or generate different routes for different machines, and can be configured to transmit corresponding route assignments to the different machines. The other modules and data 412 can be utilized by the computing system 400 to perform or enable performing any action taken by the computing system 400. For example, the other modules and data 412 can include a platform, operating system, and/or applications, as well as data utilized by the platform, operating system, and/or applications.

The communication interfaces 406 can include transceivers, modems, interfaces, antennas, and/or other components that can transmit and/or receive data over networks or other data connections. In some examples, the communication interfaces 406 can be the wireless communication interfaces 130 of the machine 102 discussed above. In other examples, the communication interfaces 406 can be configured to send data to, and/or receive data from, the wireless communication interfaces 130 of the machine 102. For instance, in examples in which the computing system 400 is the dispatch controller 110, the computing system 400 can use the communication interfaces 406 to receive the machine data 142 from the machine 102, to send the route assignment 156 to the machine 102, and/or to send or receive any other type of data.

Industrial Applicability

The machine 102 can be assigned to the route 108, such that the machine 102 can dispense material 106 at one or more material dispense areas 124 along the route 108. Before assigning the machine 102 to the route 108, the dispatch controller 110 and/or the machine 102 can verify that the machine 102 can be assigned to traverse the route 108. For example, the dispatch controller 110 and/or the machine 102 can verify that the machine 102 is carrying an amount of material 106, or would obtain an amount of material 106 along the route 108, sufficient to dispense material 106 at the material dispense areas 124 associated with the route 108. The dispatch controller 110 and/or the machine 102 can also verify that the battery 104 of the machine 102 is at a sufficient SoC, or would be recharged along the route 108 to a sufficient SoC, to power travel of the machine 102 along the route and to power operations of the material dispensers 118 to dispense material 106 at the material dispense areas 124 associated with the route 108.

As described above, as the machine 102 travels through the route 108 and dispenses material 106, the amount and/or weight of the material 106 carried by the machine 102 can decrease. The decrease in the amount and/or weight of the material 106 carried by the machine 102 can impact the expected energy consumption level associated with the route 108, for example if the machine 102 may be projected to consume less energy to traverse certain segments 114 of the route 108 due a decreased payload relative to previous segments of the route 108. Accordingly, the dispatch controller 110 and/or the machine 102 can take projected changes to the amount and/or weight of the material 106 carried by the machine into account when determining whether the battery 104 of the machine 102 is at a sufficient SoC, or would be recharged along the route 108 to a sufficient SoC, to power travel of the machine 102 and to power operations of the material dispensers 118 in association with the route 108.

Accordingly, by verifying that the machine 102 has, or would obtain, sufficient material 106 and SoC to travel through the route 108 and dispense material 106 at the material dispense areas 124 associated with the route 108, the dispatch controller 110 and/or the machine 102 can confirm that the machine 102 is likely to be able to complete the assignment by fully traversing the route 108 and by dispensing material 106 at the material dispense areas 124 associated with the route 108. The dispatch controller 110 and/or the machine 102 and/or the machine 102 and/or the machine 102 can also avoid assigning the machine 102 a different route that the machine 102 might not be able to complete, for instance if the machine 102 does not have enough material 106 to dispense at material dispense areas 124 associated with the different route, and/or if the battery 104 of the machine 102 is not at a SoC that would allow the machine 102 to fully traverse the different route and dispense material 106 at the material dispense areas 124 associated with the different route.

The dispatch controller 110 can also perform fleet management operations to assign different machines to different routes. For example, the dispatch controller can assign different machines to dispense material 106 at different material dispense areas 124 along different routes that may have different lengths, be associated with different segments 114 with different grades and/or material dispense attributes, pass through different areas of the worksite 100, and/or otherwise differ. The dispatch controller 110 can verify that each of the machines is likely to be able to complete the route assigned to that machine, and can adjust or change the route assignments associated with the machines if the dispatch controller 110 determines that any of the machines would not be able to complete candidate route assignments.

The dispatch controller 110 and/or the machine 102 can also select routes, and/or adjust routes or machine operations associated with the routes, to optimize efficiency and/or costs associated with the worksite 100 and one or more machines. For example, the dispatch controller 110 can generate a path for the route 108 in part by deprioritizing segments 114 with uphill slopes directly after visits to the material refill station 122, as the machine 102 may be carrying more weight due to a refill of material 106 and thus consume more energy during such uphill segments 114. The dispatch controller 110 can generate the path of the route 108 to defer travel through the uphill segments 114 once the machine 102 has dispersed material 106 and is projected to be carrying less weight, as the machine 102 may consume less energy when carrying less weight. The dispatch controller 110 can accordingly generate the route 108 and/or machine operations along the route 108 to prioritize lowering the overall expected energy consumption level 112 associated with the route 108, thereby increasing efficiency and lowering costs associated with providing energy to the machine 102.

While aspects of the present disclosure have been particularly shown and described with reference to the embodiments above, it will be understood by those skilled in the art that various additional embodiments may be contemplated by the modification of the disclosed machines, systems, and method without departing from the spirit and scope of what is disclosed. Such embodiments should be understood to fall within the scope of the present disclosure as determined based upon the claims and any equivalents thereof.

What is claimed is:

1. A computer-implemented method, comprising:
    determining, by one or more processors, a route associated with one or more material dispense areas;
    determining, by the one or more processors, a total amount of a material to be dispensed, at the one or more material dispense areas, by a machine having one or more material dispensers configured to dispense the material;
    determining, by the one or more processors, an expected energy consumption level, associated with traversal of the route by the machine, based on:
        a material dispense energy consumption level associated with powering the one or more material dispensers to dispense the material at the one or more material dispense areas, and
        a travel energy consumption level associated with powering travel of the machine through the route, wherein the travel energy consumption level is based at least in part on predicted changes to a weight of the material carried by the machine through the route; and
    assigning, by the one or more processors, the route to the machine.

2. The computer-implemented method of claim 1, wherein the route is assigned to the machine in response to at least one of:
    determining that a material container of the machine currently stores at least the total amount of the material, or
    determining that the route includes at least one visit to a material refill station to fill the material container with additional material to avoid the material container becoming empty during travel of the machine through the route.

3. The computer-implemented method of claim 1, wherein the route is assigned to the machine in response to at least one of:
    determining that a current state of charge (SoC) of a battery of the machine is at least the expected energy consumption level,
    determining that the route includes at least one segment associated with charging of the battery to avoid the battery becoming fully discharged during travel of the machine through the route.

4. The computer-implemented method of claim 1, wherein:
    the route is divided into a plurality of segments, and
    the material dispense energy consumption level is based on a combination of a plurality of material dispense energy consumption levels associated with one or more of material dispense rates or material dispense patterns corresponding with the material dispense areas associated with individual segments of the plurality of segments.

5. The computer-implemented method of claim 1, wherein:
    the route is divided into a plurality of segments, and
    the travel energy consumption level is based on a combination of a plurality of travel energy consumption levels associated with travel through individual segments, the plurality of travel energy consumption levels being based in part on predicted weights of the material carried by the machine though individual segments of the plurality of segments.

6. The computer-implemented method of claim 1, wherein determining the route comprises one of:
    selecting the route from a set of predetermined routes, or
    generating the route based on an indication of the one or more material dispense areas.

7. The computer-implemented method of claim 1, wherein the machine is a water truck, and the material is water to be sprayed at the one or more material dispense areas by the one or more material dispensers.

8. The computer-implemented method of claim 1, further comprising adjusting one or more attributes of the route to alter at least one of:
    the total amount of the material to be dispensed,
    the expected energy consumption level, or
    a projected operation cost associated with assigning the route to the machine.

9. The computer-implemented method of claim 1, wherein:
    the machine is an autonomous machine, and
    assigning the route to the machine comprises generating a route assignment for the machine and transmitting the route assignment to the machine, the route assignment comprising autonomous machine instructions indicating:
        driving instructions associated with automatic travel of the machine through the route; and
        material dispense instructions associated with automatic operations of the one or more material dispensers to dispense the material at the one or more material dispense areas.

10. The computer-implemented method of claim 1, wherein:
    the machine is a semi-autonomous machine, and
    assigning the route to the machine comprises generating a route assignment for the machine and transmitting the route assignment to the machine, the route assignment indicating:
        navigation instructions, configured for presentation to a human operator via a user interface of the machine, associated with travel of the machine through the route; and
        material dispense instructions associated with automatic operations of the one or more material dispensers to dispense the material at the one or more material dispense areas.

11. A computing system, comprising:
one or more processors; and
memory storing computer-executable instructions that, when executed by the one or more processors, cause the one or more processors to perform operations comprising:
  determining a route associated with one or more material dispense areas;
  determining a total amount of a material to be dispensed, at the one or more material dispense areas, by a machine having one or more material dispensers configured to dispense the material;
  determining an expected energy consumption level, associated with traversal of the route by the machine, based on:
    a material dispense energy consumption level associated with powering the one or more material dispensers to dispense the material at the one or more material dispense areas, and
    a travel energy consumption level associated with powering travel of the machine through the route, wherein the travel energy consumption level is based at least in part on predicted changes to a weight of the material carried by the machine through the route; and
  assigning the route to the machine.

12. The computing system of claim 11, wherein:
the route is divided into a plurality of segments, and
the material dispense energy consumption level is based on a combination of a plurality of material dispense energy consumption levels associated with one or more of material dispense rates or material dispense patterns corresponding with the material dispense areas associated with individual segments of the plurality of segments.

13. The computing system of claim 11, wherein:
the route is divided into a plurality of segments, and
the travel energy consumption level is based on a combination of a plurality of travel energy consumption levels associated with travel through individual segments, the plurality of travel energy consumption levels being based in part on predicted weights of the material carried by the machine though individual segments of the plurality of segments.

14. The computing system of claim 11, further comprising adjusting one or more attributes of the route to change at least one of:
the total amount of the material to be dispensed,
the expected energy consumption level, or
a projected operation cost associated with assigning the route to the machine.

15. A dispatch controller, comprising:
one or more processors; and
memory storing computer-executable instructions that, when executed by the one or more processors, cause the one or more processors to perform operations comprising:
  determining a route associated with one or more material dispense areas;
  determining an expected energy consumption level associated with traversal of the route by a machine having one or more material dispensers configured to dispense the material, based on:
    a material dispense energy consumption level associated with powering the one or more material dispensers to dispense the material at the one or more material dispense areas, and
    a travel energy consumption level associated with powering travel of the machine through the route, wherein the travel energy consumption level is based at least in part on predicted changes to a weight of the material carried by the machine through the route;
  receiving machine data, from the machine, indicating a current state of charge (SoC) of a battery of the machine;
  determining that the current SoC is at or above the expected energy consumption level associated with traversal of the route by the machine; and
  assigning the route to the machine in response to determining that the current SoC is at or above the expected energy consumption level.

16. The dispatch controller of claim 15, wherein the operations further comprise:
  determining that the current SoC is below the expected energy consumption level associated with traversal of the route by the machine;
  adjusting the route, wherein adjusting the route lowers the expected energy consumption level associated with traversal of the route; and
  determining, based on the adjusting, that the current SoC is at or above a lowered value of the expected energy consumption level associated with traversal of the route.

17. The dispatch controller of claim 16, wherein:
adjusting the route comprises:
  selecting a different set of one or more material dispense areas; and
  adjusting a path of the route to be associated with the different set of one or more material dispense areas, and
adjusting the path alters the predicted changes to the weight of the material carried by the machine through the route.

18. The dispatch controller of claim 15, wherein:
the route is divided into a plurality of segments, and
the travel energy consumption level is based on a combination of a plurality of travel energy consumption levels associated with travel through individual segments, the plurality of travel energy consumption levels being based in part on predicted weights of the material carried by the machine though individual segments of the plurality of segments.

19. The dispatch controller of claim 15, wherein the route is determined based on a selection of the route from a set of predetermined routes associated with different sets of material dispense areas.

20. The dispatch controller of claim 19, wherein the route is a first route and the operations further include:
  selecting a second route from the set of predetermined routes for a second machine;
  determining a second expected energy consumption level associated with traversal of the second route by the second machine, based at least in part on predicted changes to a second weight of second material carried by the second machine through the second route;
  determining that a second SoC of a second battery of the second machine is at or above the second expected energy consumption level; and
  assigning the second route to the second machine in response to determining that the second SoC is at or above the second expected energy consumption level.

* * * * *